(12) United States Patent
Evans et al.

(10) Patent No.: US 7,609,208 B2
(45) Date of Patent: Oct. 27, 2009

(54) ELECTRODES ON A PHOTOCONDUCTIVE SUBSTRATE FOR GENERATION AND DETECTION OF TERAHERTZ RADIATION

(75) Inventors: Michael J. Evans, Cambridge (GB); William R. Tribe, Cambridge (GB)

(73) Assignee: Teraview Limited, Cambridge (GB)

( * ) Notice: Subject to any disclaimer, the term of this patent is extended or adjusted under 35 U.S.C. 154(b) by 387 days.

(21) Appl. No.: 10/526,556

(22) PCT Filed: Sep. 4, 2003

(86) PCT No.: PCT/GB03/03843

§ 371 (c)(1),
(2), (4) Date: Jul. 25, 2005

(87) PCT Pub. No.: WO2004/023566

PCT Pub. Date: Mar. 18, 2004

(65) Prior Publication Data

US 2006/0152412 A1    Jul. 13, 2006

(30) Foreign Application Priority Data

Sep. 4, 2002    (GB) .................. 0220561.5

(51) Int. Cl.
*H01Q 1/38* (2006.01)
*H01Q 9/16* (2006.01)

(52) U.S. Cl. .............. 343/700 MS; 343/793; 343/895

(58) Field of Classification Search ........ None
See application file for complete search history.

(56) References Cited

U.S. PATENT DOCUMENTS

| 4,696,648 | A | * | 9/1987 | Slayman et al. ........... 438/92 |
| 4,772,931 | A |  | 9/1988 | Rogers |
| 4,998,154 | A |  | 3/1991 | Surridge et al. |
| 5,028,971 | A | * | 7/1991 | Kim et al. ................ 257/459 |
| 5,222,162 | A |  | 6/1993 | Yap et al. |
| 5,283,584 | A |  | 2/1994 | Kim et al. |
| 5,371,399 | A | * | 12/1994 | Burroughes et al. ........ 257/451 |
| 5,515,066 | A |  | 5/1996 | Kim et al. |
| 6,111,305 | A | * | 8/2000 | Yoshida et al. ............. 257/656 |
| 6,207,473 | B1 | * | 3/2001 | Hirai et al. ................ 438/106 |
| 7,015,560 | B2 | * | 3/2006 | Kim et al. ................. 257/457 |

FOREIGN PATENT DOCUMENTS

| GB | 2306247 A | 4/1997 |
| JP | 11-343217 | * 9/1999 |

OTHER PUBLICATIONS

Jpn. J. Appl. Phys. vol. 41, 2002, Jiang et al., "GaN Metal-Semiconductor-Metal UV Photodetector with Recessed Electrodes," pp. L34-L36.

* cited by examiner

*Primary Examiner*—Trinh V Dinh
(74) *Attorney, Agent, or Firm*—Dickstein Shapiro LLP

(57) ABSTRACT

An antenna comprising a photoconductive material (61) and a plurality of spaced apart electrodes (69, 71) provided on said photoconductive material (61), each electrode (69, 71) having at least one facing edge which faces a facing edge of an adjacent electrode, a physical barrier (67) being provided abutting a facing edge of at least one electrode (69, 71), said barrier (67) extending to at least the full height of said facing edge.

21 Claims, 16 Drawing Sheets

ELECTRODES ON A PHOTOCONDUCTIVE SUBSTRATE FOR GENERATION AND DETECTION OF TERAHERTZ RADIATION

The present invention relates to the field of antennas for receiving and/or transmitting radiation and methods for operating such antennas. More specifically, the present invention relates to the field of antennas which operate in the frequency range colloquially referred to as the TeraHertz frequency range, the range being that from 25 GHz to 100 THz, particularly that in the range of 50 GHz to 84 THz, more particularly that in the range from 90 GHz to 50 THz and especially that in the range from 100 GHz to 20 THz.

Such radiation is non-ionising and, as a result, it is particularly of use in medical applications.

Terahertz radiation may be generated or detected using so-called photoconductive antennas, which comprise two electrodes provided on the surface of a photoconductive substrate. To generate radiation such an antenna may be excited by directing a pulse onto such a device. When a bias is applied to the electrodes, a photogenerated current flows between the electrodes with transients radiating in broadband with frequencies up to the THz range.

Alternatively, the device may be irradiated using two CW lasers of slightly different frequencies. When biased, the non-linear I-V characteristics of the device leads to photomixing of the two CW lasers and reradiation at the difference of their different frequencies. This allows the antenna to output frequencies up to the 1 to 3 THz range.

For detection, the antenna may be excited by irradiating the antenna with a pulse or two CW lasers of differing frequencies. This exciting radiation is incident on the antenna side of the photoconducting substrate, the THz radiation which is to be detected is incident on the opposing side of the photoconductive substrate. When both the exciting radiation and the THz radiation are incident on the device, the current flows between the electrodes.

When configured as an emitter, the power emitted by the antenna increases with the bias voltage supplied to the electrodes and, to a certain extent, the shape of the electrodes. The maximum voltage which can be applied to the electrodes is limited by the "dielectric breakdown" electric-field value for the photoconductive substrate. However, in many cases, this is not the limiting factor, because thermal effects, such as thermal runaway (induced by excessive power dissipation) will destroy a device prior to electrical breakdown.

Although the above breakdown mechanisms cause catastrophic and essentially instantaneous failure, a further long-term failure mechanism also occurs. During operation as either an emitter or a detector, high current densities are flowing within the electrodes and atomic motion in the electrodes may result in device failure-. The onset of this phenomena is typically considered to be in the region of $1 \times 10^5 \text{Acm}^{-2}$. This failure mechanism is known as electromigration or stress migration.

Jiang et al. "GaN Metal-Semiconductor-Metal UV Photodetector with Recessed Electrodes" in Jpn. J. Appl. Phys. Vol. 41 (2002) pp. L34-L36 describes an ultraviolet photodetector which has recessed electrodes. It was found that these recessed electrodes assisted in maintaining an enhanced and uniform electric field in the photoconductor material. The fabrication method used to produce these recessed electrodes results in these electrodes at least partially protruding over the top of the recesses. This means, that electromigration will still occur and will still have a negative effect on the performance of such a device.

The present invention attempts to address the above problems and, in a first aspect provides an antenna comprising a photoconductive material and a plurality of spaced apart electrodes provided on said photoconductive material, each electrode having at least one facing edge which faces a facing edge of an adjacent electrode, a physical barrier being provided abutting a facing edge of at least one electrode, said barrier extending to at least the full height of said facing edge.

The antenna may be configured to operate as an emitter, where the electrodes are used to apply a bias across the photoconductive material or a detector, where the electrodes are used to measure a current flowing in the photoconductive material due to suitable irradiation.

The physical barrier will either equal the height of the facing edge or exceed the height of the facing edge. The height of the facing edge being measured such that it includes any shards of metal or surface roughness of the electrode.

The physical barrier may conveniently be provided by a recess in the surface of the photoconductive material. For example, the electrode may be provided in a trench which is etched into the photoconductive material.

The side walls of the trench may preferably extend to at least the full height of the facing edge of the electrode. However, the side walls may only extend to a part of the full height and a capping material may be provided as a barrier for the remainder of the electrode facing edge.

Preferably, adjacent facing edges are provided in adjacent recesses such that photoconductive material is provided between both facing edges and the side walls of recesses in the photoconductive material provide the said barrier for the adjacent facing edges.

A capping material may also be provided as the barrier material on its own. For example, the electrode may be provided on the planar surface of the photoconductive material and may be covered with capping material such that capping material completely covers the facing edges.

Capping material may also be used to cover the upper surfaces of electrodes when the side facing edges of the electrodes are completely abutted against the side walls of recesses.

Preferably an anti-reflective capping material is used in order to enhance power output from the device. The capping material may comprise silicon nitride, silicon dioxide, silicon monoxide, photoresist, polymide and acrylics.

The electrodes preferably comprise metallic schottky gates. Preferably, the facing edges of adjacent electrodes are separated by a gap of less than 100 μm. Many different electrode designs may be used such as a dipole design comprising two electrodes with either blunt or sharp metal edges, a bowtie design comprising two triangular electrodes with their facing edges provided at the apexes of the triangles, a spiral design or a design comprising a plurality of interleaved metallic fingers. Where the design comprises a plurality of interleaved metallic fingers, the space in between the facing edges of adjacent fingers may be less than 1am. This design allows a very large electric field to be applied for low values of applied bias with a relatively large current flow.

In practice, when operating as an emitter a bias will be applied between the two electrodes. Since the electrodes may safely withstand the electro migration threshold, a bias which induces a current density which exceeds this threshold may be safely applied and hence a higher output from the antenna may be produced. Thus, preferably, the antenna comprises biasing means configured to apply a bias between facing edges of adjacent electrodes, said biasing means being configured to bias the electrodes such that the current density of a facing edge exceeds the current density at which electromigration occurs.

The electromigration threshold for many metals is well established. Typically, electrodes will be made from gold, aluminum, titanium, NiCr or palladium. The onset of electromigration is typically considered to take place when the areal current density flowing through an electrode reaches the order of $10^5$ A/cm$^2$ (reference S. M. Sze "Semiconductor devices, Physics and Technology", John Wiley & Sons, New York (1985)).

When configured as a generator, the antenna is irradiated with exciting radiation which may be pulsed radiation or CW radiation comprising at least two different frequencies. For generation of THz radiation, wavelengths of the exciting radiation will typically be in the range from 780 nm to 850 nm. This wavelength range is particularly preferable when GaAs is used as the photoconducting material. However, it should be noted that other wavelengths may be used with other photoconducting materials.

When configured as a detector, means are provided to sense current flowing in the electrodes due to irradiation by exciting radiation, and the radiation which is to be detected.

The wavelengths of the exciting radiation will typically be in the range from 780 nm to 850 nm. This wavelength range is particularly preferable when GaAs is used as the photoconducting material. However, it should be noted that other wavelengths may be used with other photoconducting materials.

Preferably, the photoconductive material is a material which has a relatively short lifetime in order to limit the duration of current flow due to the biasing of the electrodes, and therefore of power dissipation, and to prevent the build up of spatial charges. Furthermore, high resistivity material is necessary to permit the application of a large bias, without drawing excessive and damaging current flows. Suitable materials are often semiconductor materials which are grown at low temperatures (typically 200-300 C rather than the more usual growth temperatures in the region of 600 C), or materials which have been implanted with ions after growth. For example, low temperature GaAs (denoted LT GaAs), arsenic implanted GaAs (As—GaAs), LT InGaAs, or LT AlGaAs.

In a preferred embodiment of the present invention, the barriers are completely provided by side walls of recesses etched in the photoconducting material. Such a structure may be conveniently fabricated using a self-aligned fabrication technique where the photoconducting material is patterned using the standard photolithographic or electron-beam photolithography techniques, where a single patterning step is used to provide the pattern for both the etch of the photoconducting material and the electrode metallization.

It is important to avoid the occurrence of shards of metal at the facing edges which may cause singularities in the electric field. Whereas in the prior art the presence of surface metallization, and possibly sharp metallic features, is inherent in the formation technique, with the use of appropriate and well established metallization techniques the recessing approach described above can lead to truly subsurface electrode geometries.

The conducting material which forms the electrodes is preferably evaporated at a rate of less than or equal to 0.2 nm per second.

It is possible to set the barrier height such that it greatly exceeds that of the intended height of the facing edge to ensure that the barrier is larger than all possible metal shards. By intended height, the inventor's mean the electrode height in the absence of shards of metal. However, when the barrier is provided by the photoconducting material, the height of the photoconducting material should not greatly exceed the height of the facing edge since the intensity of the optical field in the barrier due to penetration of the incident radiation will decay as a function of depth within the photoconducting material. The density of photocreated charge carriers is a function of the intensity of the optical field, and hence for efficient emission or detection of radiation, the maximum optical field should be spatially located in the region of the maximum electric field caused by the electrodes. If the electrodes are well recessed from the top of the photoconducting material then only a weak optical field will be present in the region of the maximum electric field caused by the electrodes.

Therefore, preferably, the height of the sidewalls of the photoconducting material should not exceed the height of the facing edge of the electrode by more than twice the penetration depth of the incident radiation. More preferably, the height of the sidewalls of the photoconducting material do not exceed the height of the facing edges by more than the penetration depth of the incident radiation.

When the antenna is configured as an emitter, the incident radiation refers to the radiation which is used to excite the antenna When the antenna is configured as a detector, exciting radiation is incident on the main surface of the antenna which comprises the electrodes and the radiation which is to be detected is incident on the opposing side of the detector. The penetration depth refers to the penetration depth of the exciting radiation incident on the main surface of the antenna.

The penetration depth is a well understood quantity and relates to the depth at which the intensity of radiation penetrating a material drops by a factor of 1/e.

Typically, the height of the sidewalls of the photoconducting material will exceed the height of the electrode facing edge by at most 1 μm, more preferably, less than 0.5 μm, even more preferably less than 0.1 μm.

Ideally, the best results are obtained by obtaining smooth metallization and decreasing the height of the photoconductive material which exceeds the facing edge to as small a value as possible.

The present invention will now be described with reference to the following non-limiting preferred embodiments in which.

Figure 12:
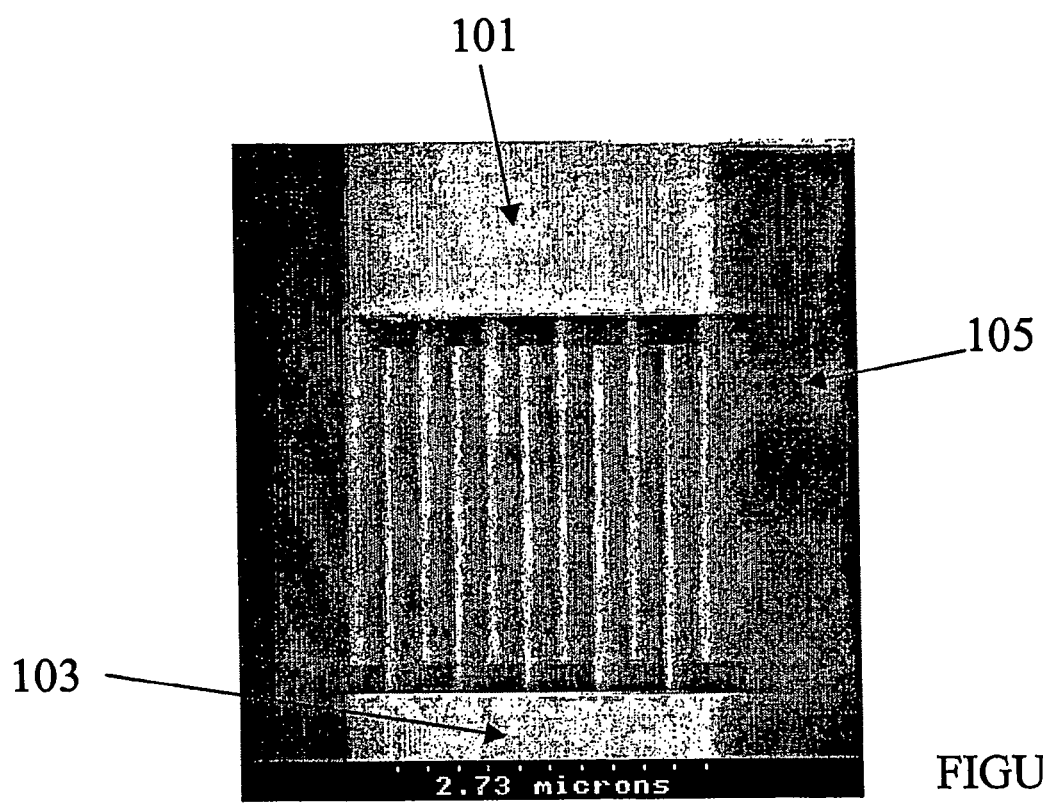
Figure 13:
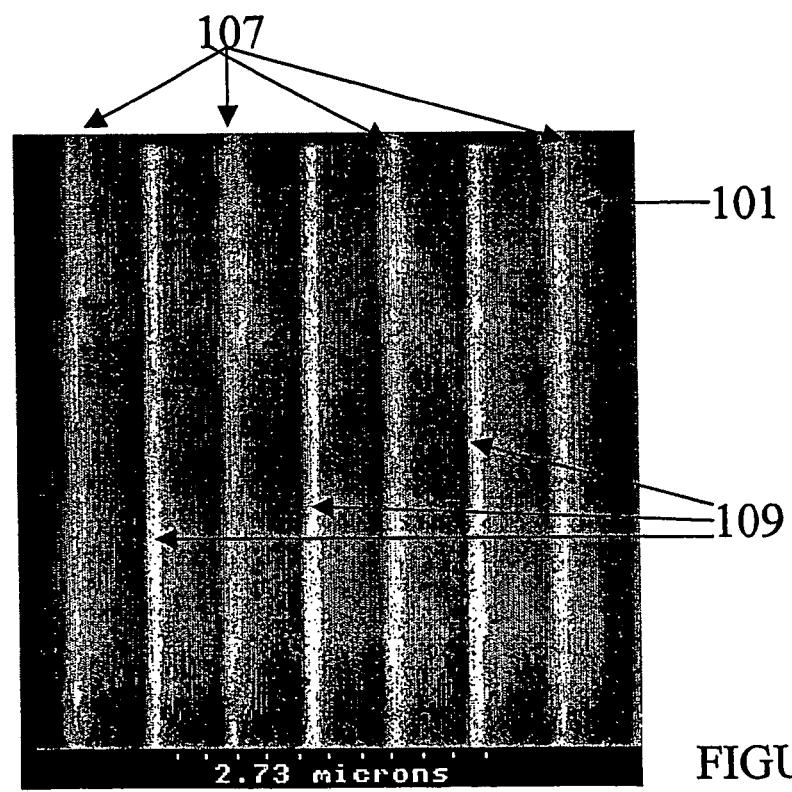
Figure 14:
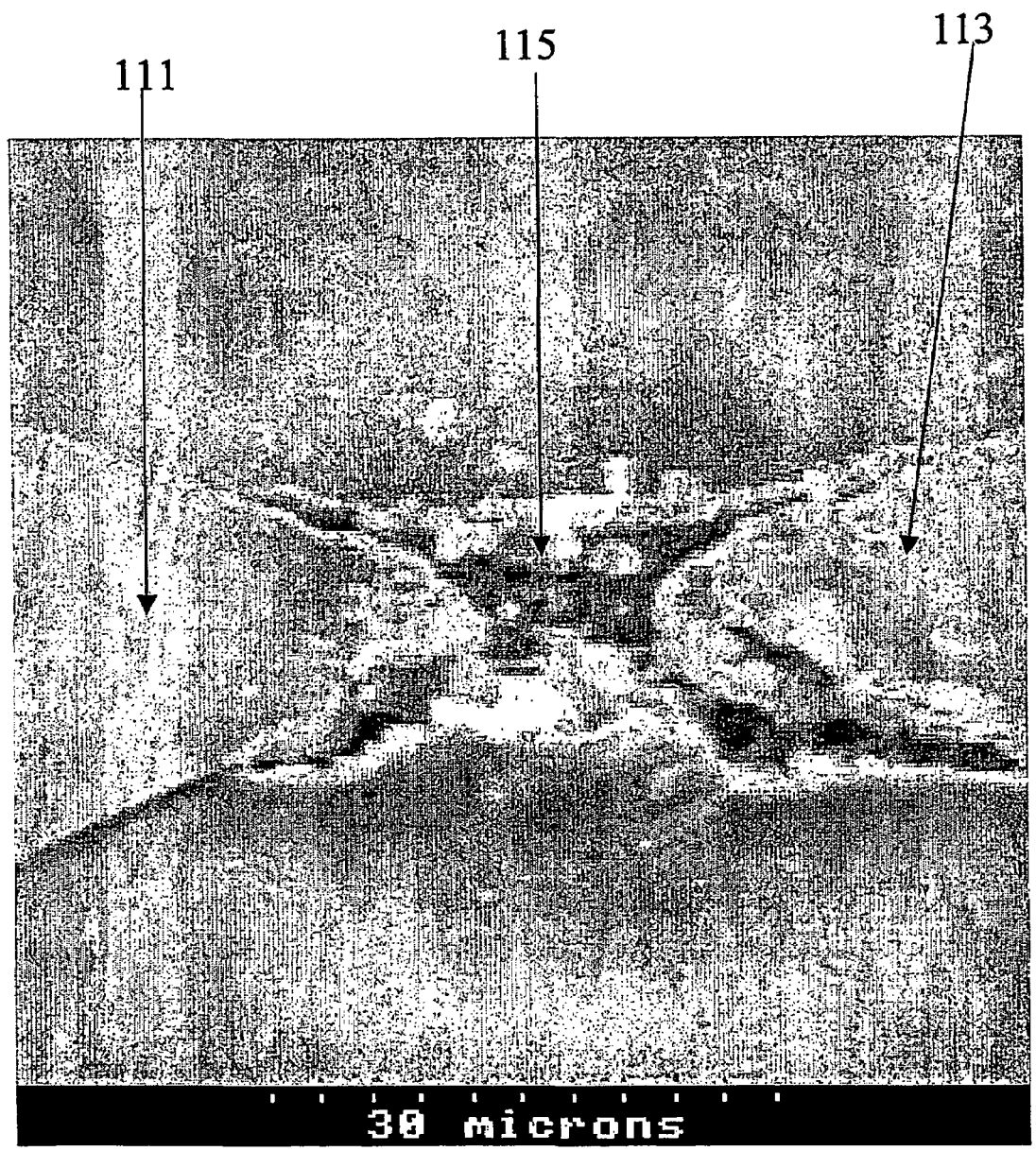
Figure 15:
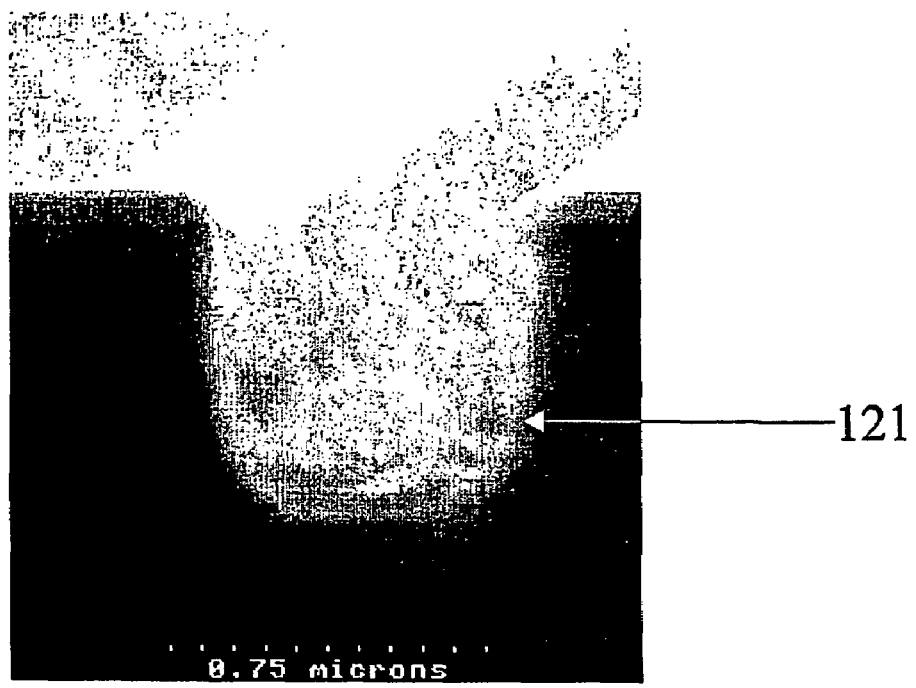
Figure 16:
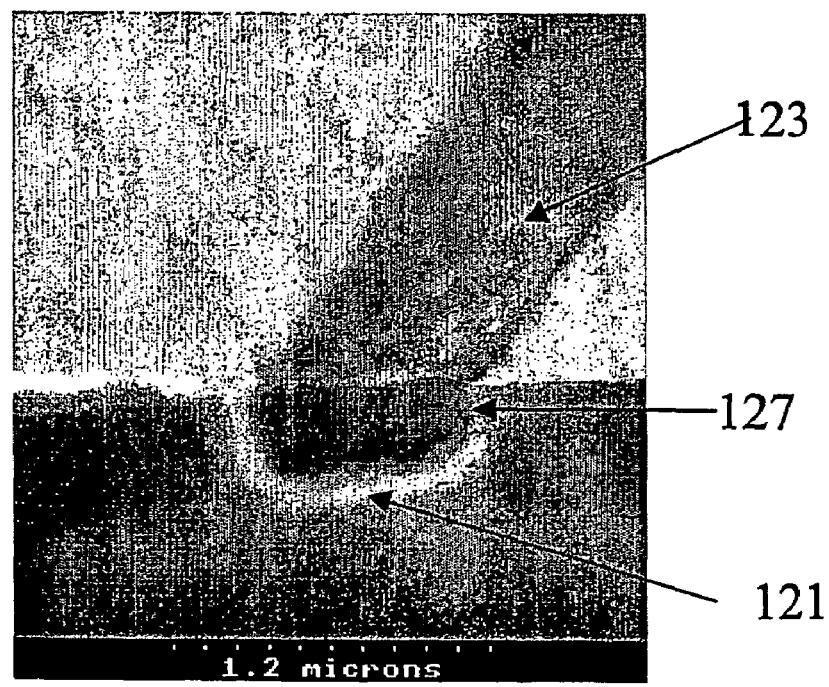
Figure 17:
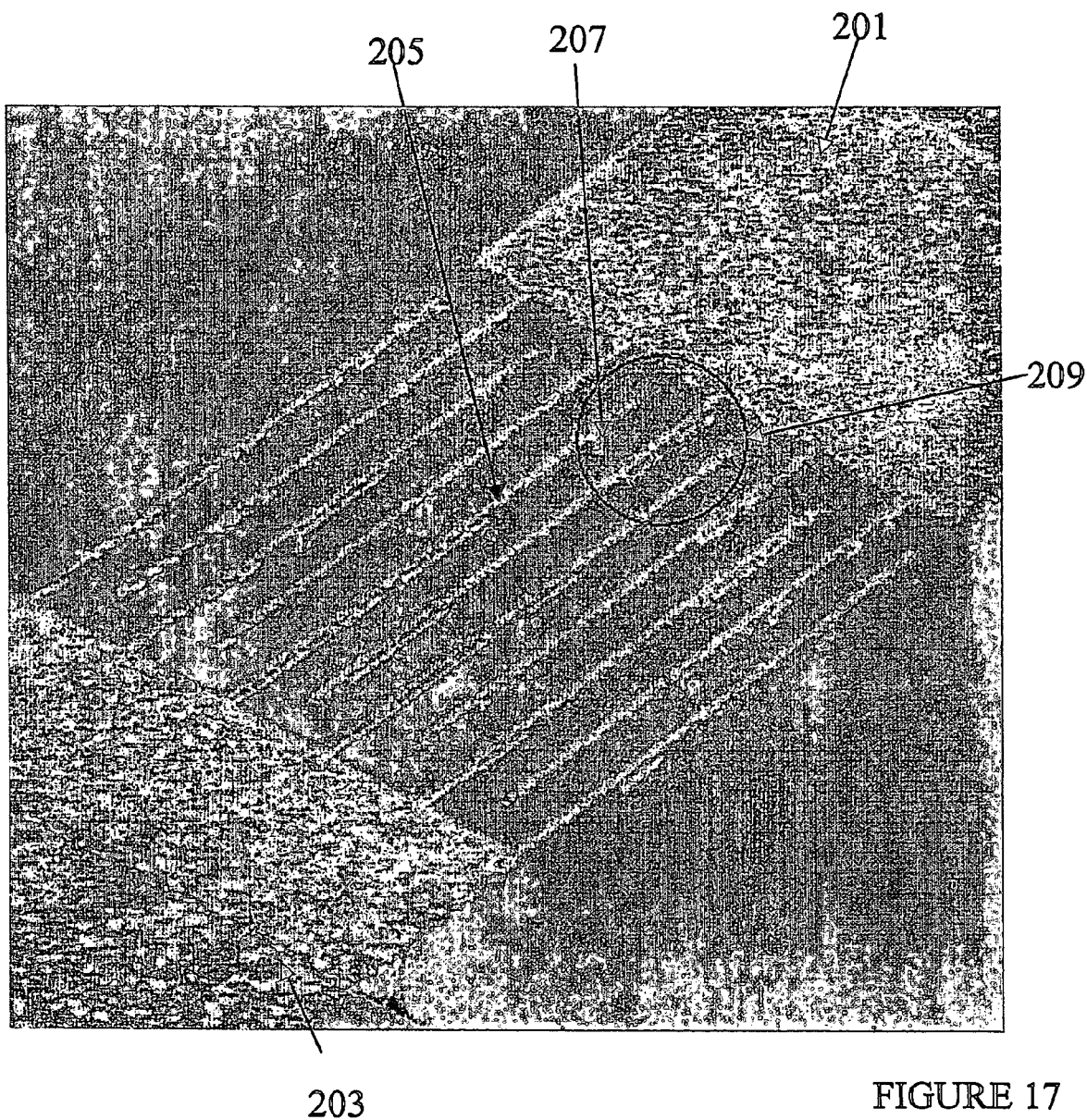
Figure 18:
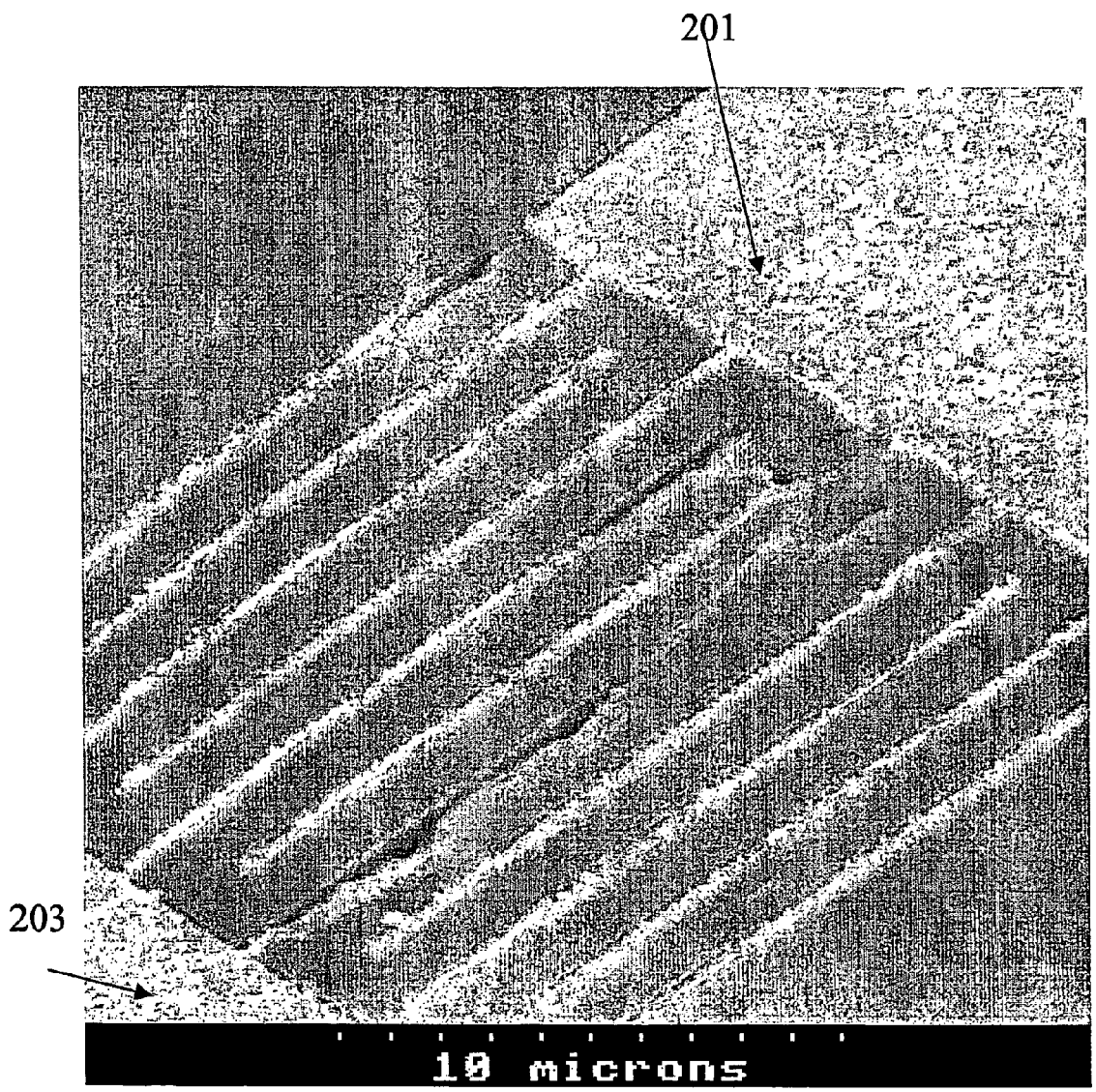
Figure 19:
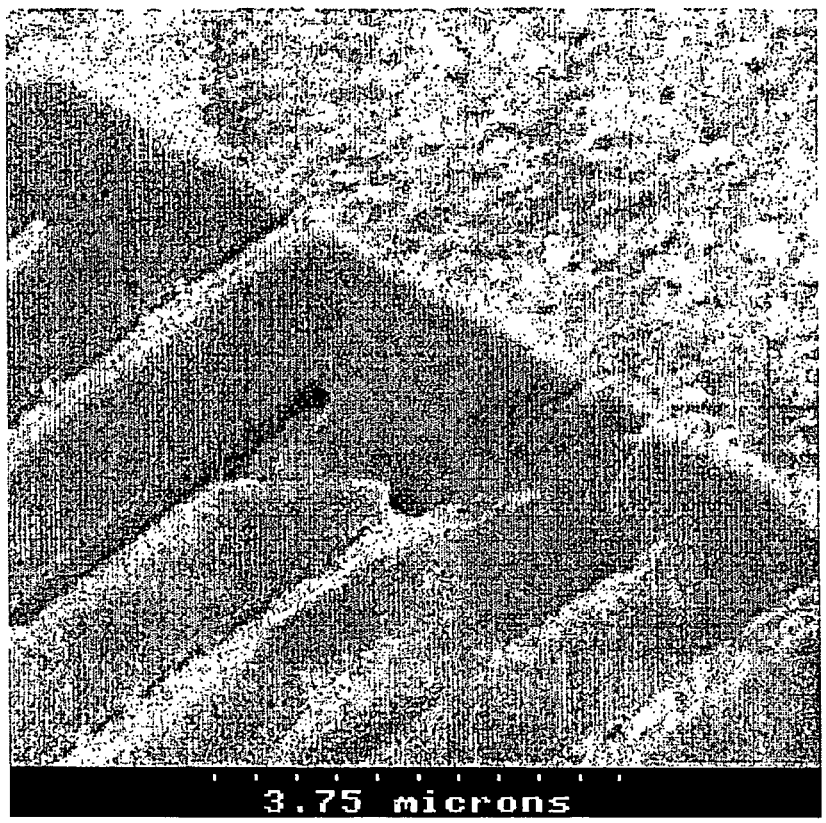
Figure 20:
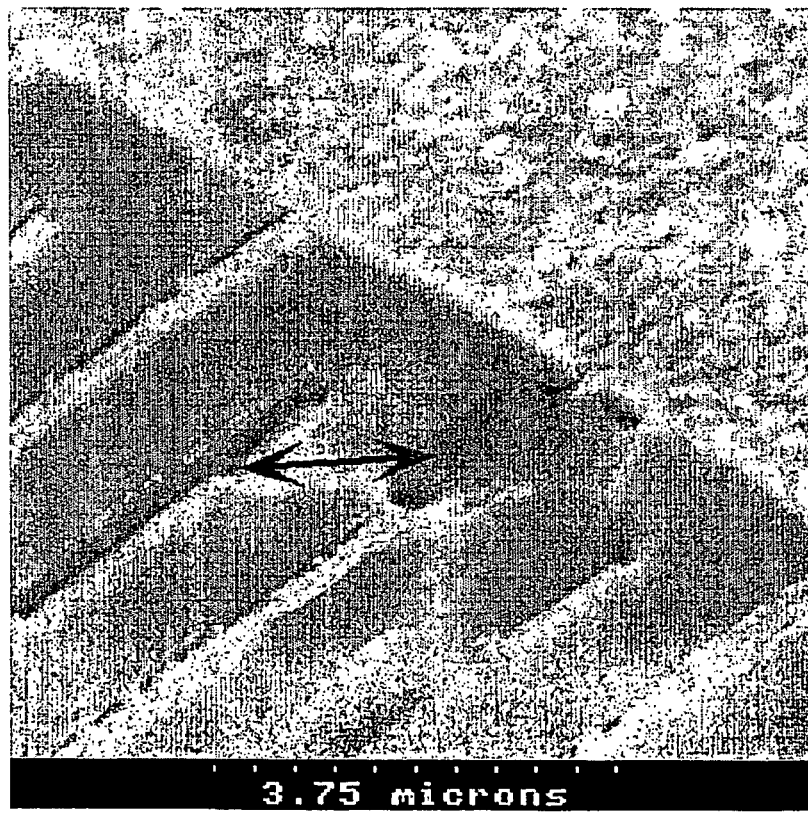
Figure 21:
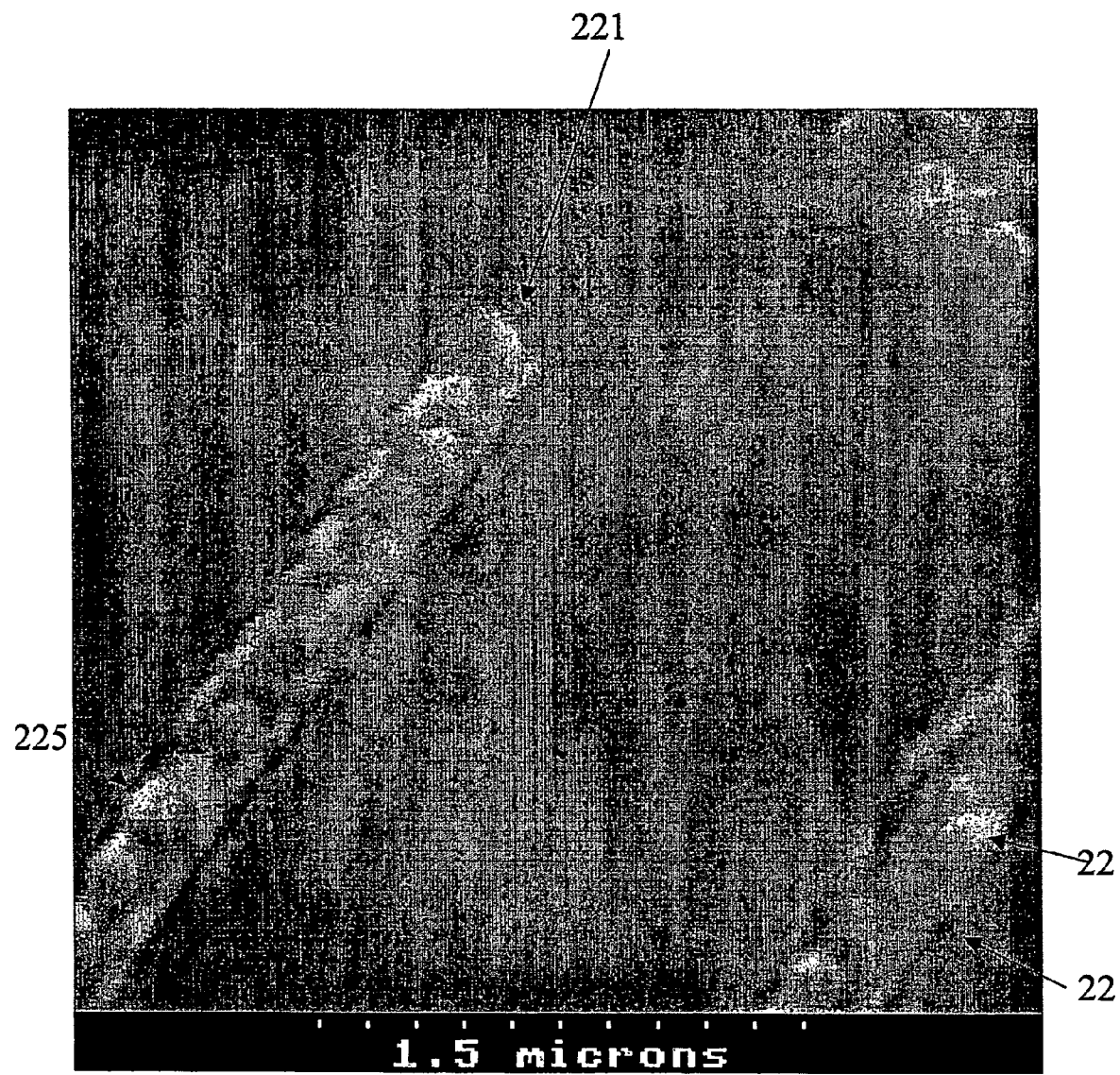
Figure 22:
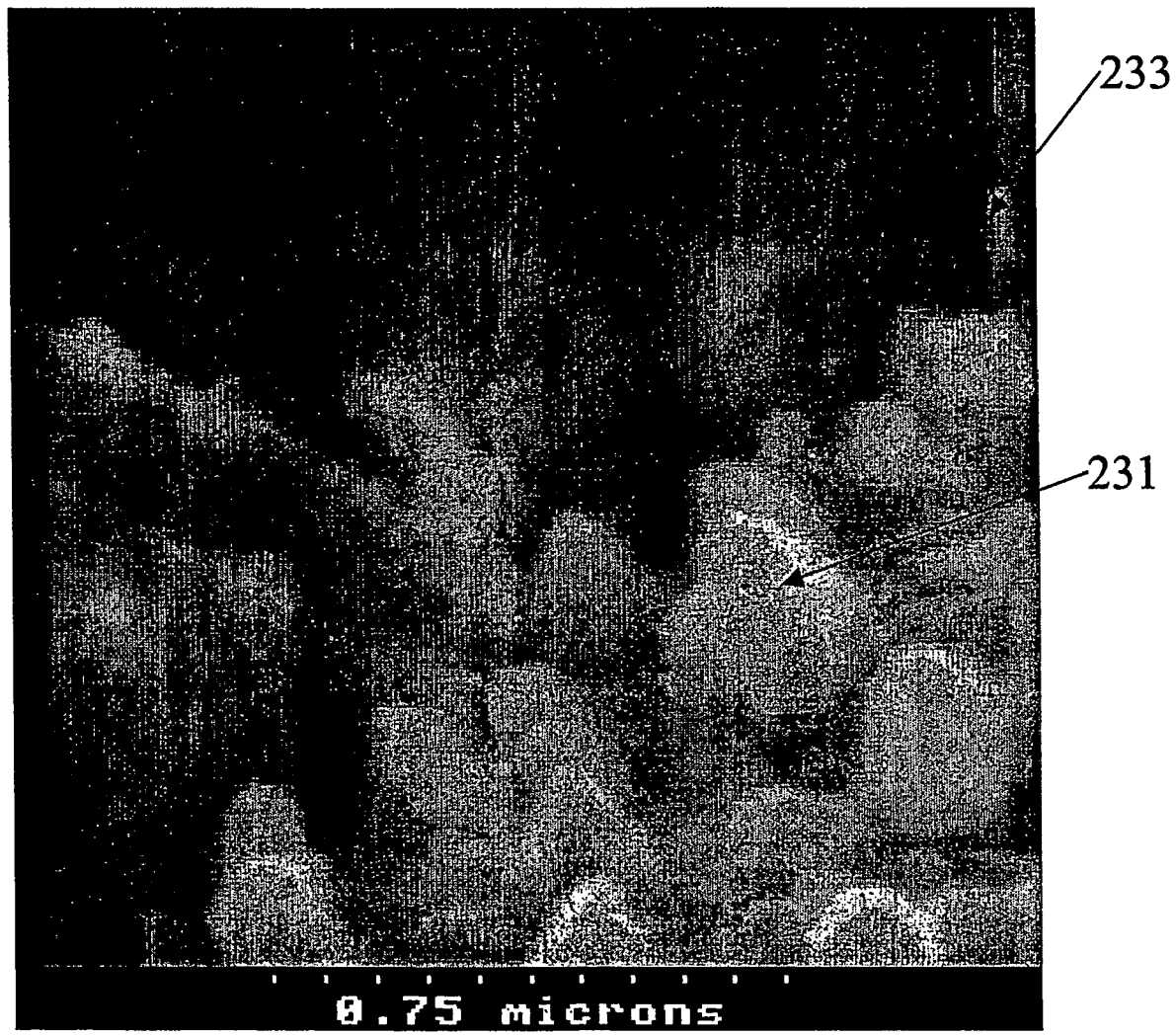
Figure 23:
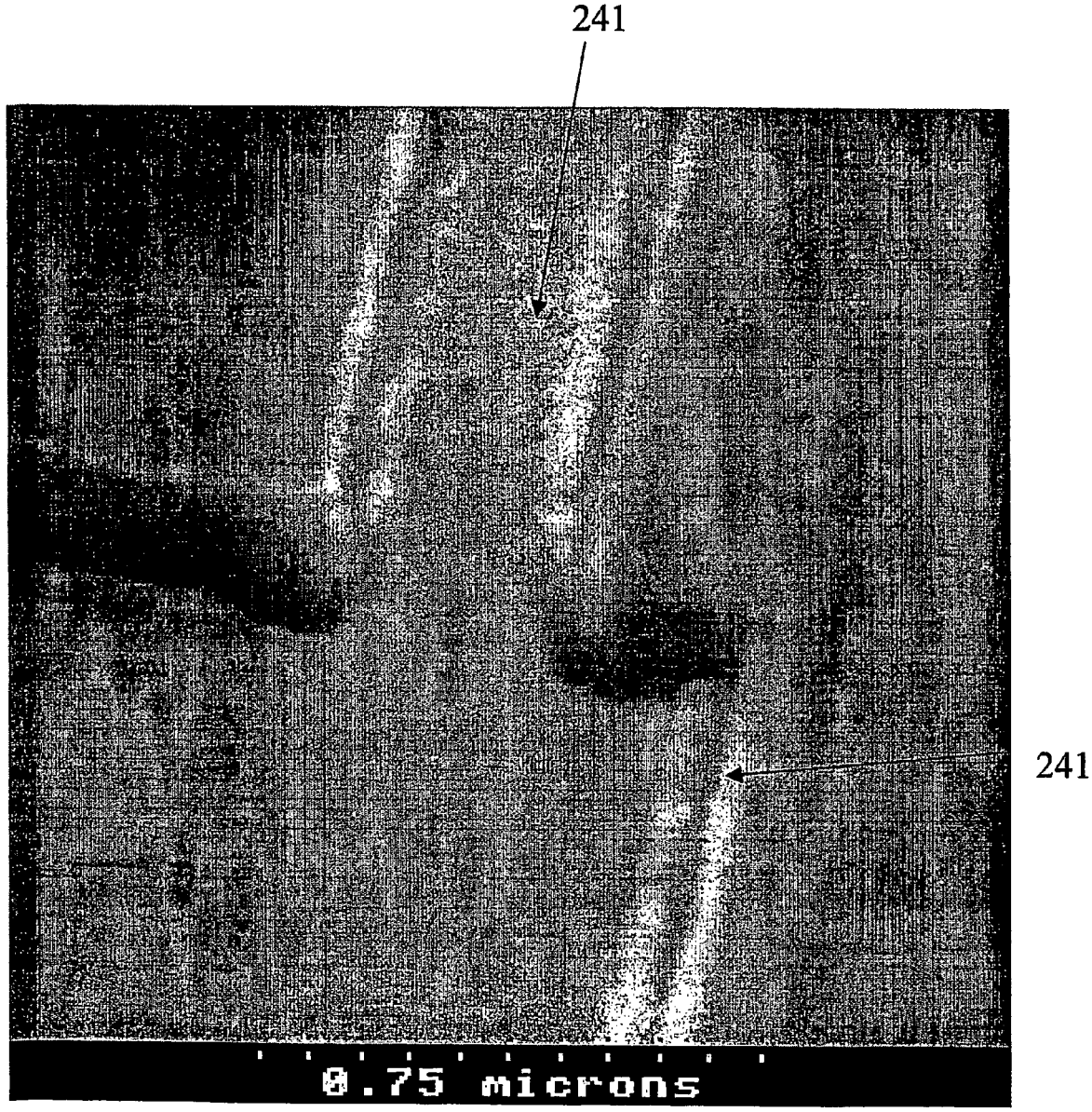

FIGS. 11A, 11B, 11C, 11D and 11E schematically illustrate a fabrication method to produce a photoconducting antenna in accordance with an embodiment of the present invention;

FIG. 12 illustrates a planar photoconducting antenna with electrodes provided in an interdigitated arrangement as a comparative example;

FIG. 13 illustrates the interdigitated electrodes of FIG. 12 on a larger scale;

FIG. 14 illustrates the breakdown of a planar bow-tie antenna as a comparative example;

FIG. 15 illustrates a recess etched into photoconducting material in accordance with a fabrication step for manufacturing an antenna in accordance with an embodiment of the present invention;

FIG. 16 illustrates a recess etched into photoconducting material and filled with metal in accordance with a fabrication step for manufacturing an antenna in accordance with an embodiment of the present invention;

FIG. 17 illustrates a photoconducting antenna having an interdigitated arrangement, the electrodes are partially recessed but metal shards protrude above the surface of the photoconducting material;

FIG. 18 illustrates the antenna of FIG. 17 after failure;

FIG. 19 illustrates the photoconducting antenna after failure of FIG. 18 on a smaller scale;

FIG. 20 is an annotated version of FIG. 19;

FIG. 21 illustrates uneven metal provided in a recess;

FIG. 22 illustrates metalisation formed within a recess of a photoconducting material; and FIG. 23 illustrates a recessed electrode which may be used in an antenna according to an embodiment of the present invention.

Figure 1:
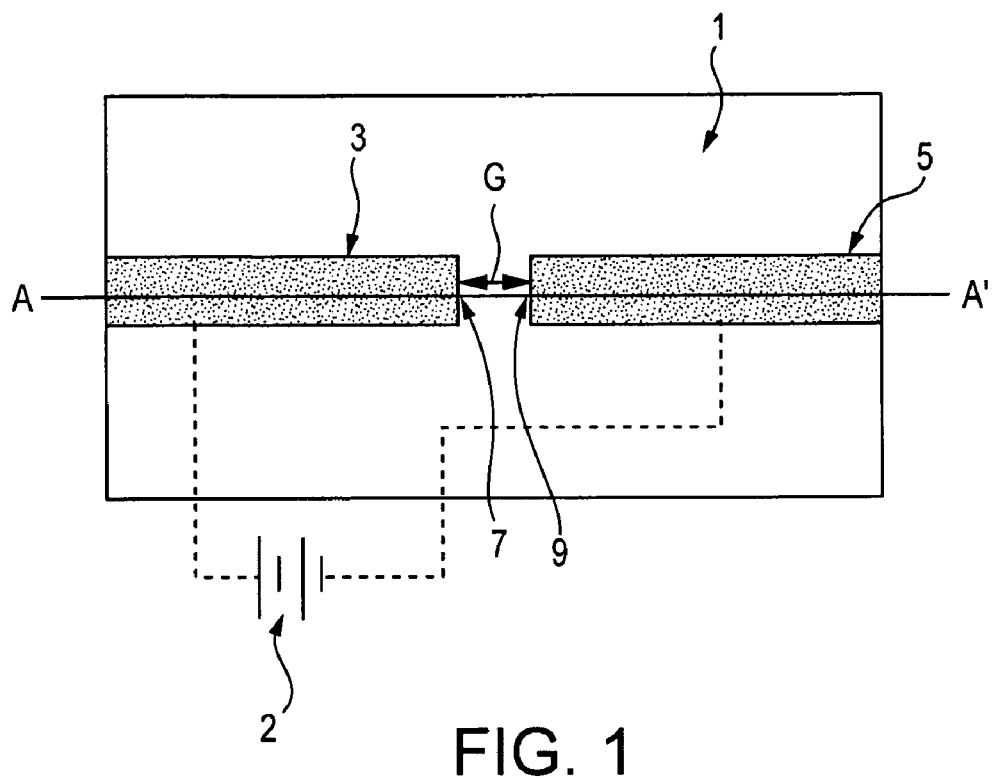
FIG. 1 is a schematic plan view of a photoconducting antenna, the electrodes have a dipole arrangement.

FIG. 1 is a schematic of a photoconducting antenna having a standard dipole electrode arrangement with flat edges. The antenna comprises photoconducting material 1 having a planar surface. Two planar electrodes 3, 5 are provided on the planar surface of the photoconducting material 1. The planar electrodes are generally elongate in shape and are separated by a gap G formed between their facing edges 7, 9 respectively. The elongated electrodes 3, 5 are aligned along their elongate axes such that their facing edges are formed by the short edge of the electrodes.

If the antenna is configured as an emitter, the electrodes will be connected to a power supply 2 in order to apply a bias to the electrodes and hence a bias across the gap G.

The bias across gap G causes a photocurrent to flow between the two electrodes when the device is illuminated. If the device is illuminated with a pulsed laser, the generated photocurrent has transients radiating in the broad band with frequencies up to the THz range thus allowing the antenna to emit radiation in the THz range.

If the device is illuminated using two continuous wave (CW) lasers of slightly different frequencies, the non-linear I-V characteristics of the device lead to photomixing of the radiation from the two CW lasers and reradiation at a frequency equal to the difference of the two exciting frequencies.

If the antenna is configured as a detector, in practice, the electrodes will be connected to a current sensing circuit or the like. When the front surface of the antenna, i.e. the surface of the antenna with the electrodes, is illuminated with pulsed radiation or CW radiation comprising at least two distinct frequencies and the opposing surface or back surface of the antenna is illuminated with 1 Hz radiation, a current flows between the electrodes allowing the THz radiation to be detected.

Figure 2:
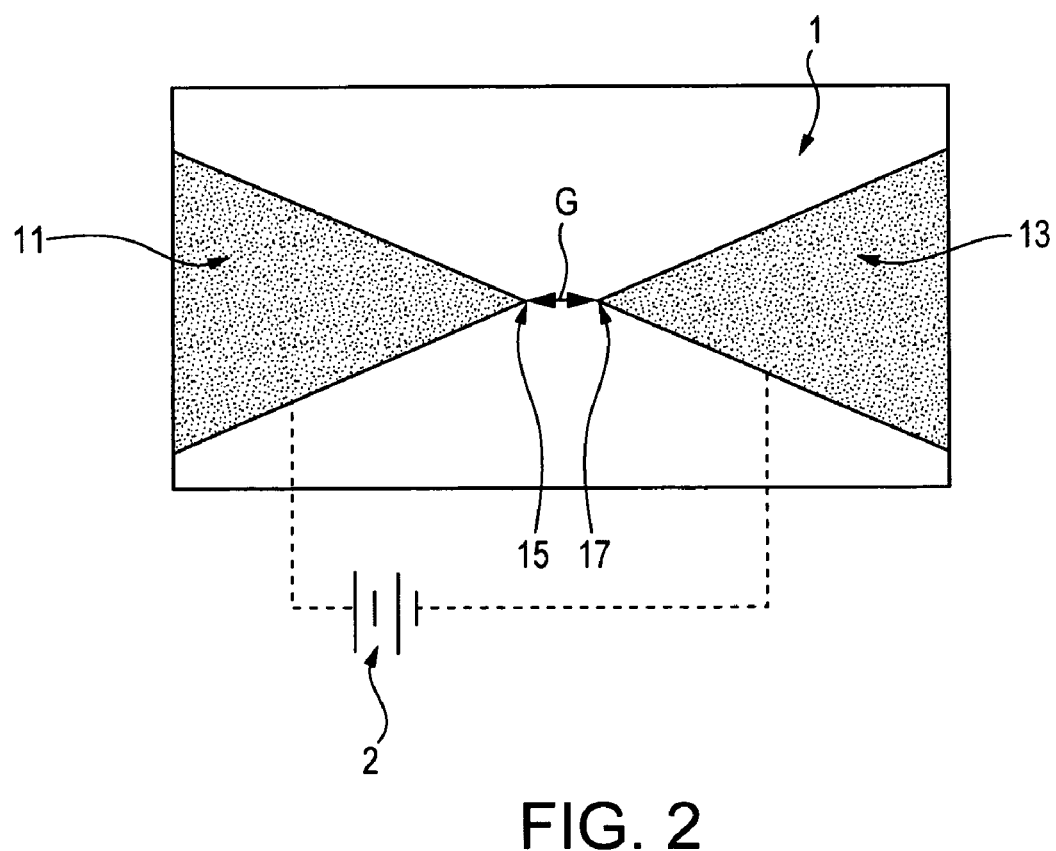
FIG. 2 is a schematic plan view of a photoconducting antenna, the electrodes have a "bow-tie" arrangement.

Dipole antennas of the type explained with reference to FIG. 1 are strongly resonant and maximise the output efficiency at the resonant frequency FIG. 2 illustrates a bow-tie antenna. In this bow-tie antenna, two planar electrodes 11, 13 are provided on a planar photoconducting substrate 1. Electrodes 11, 13 are generally triangular in shape and are aligned along their central axes with their central apexes 15, 17 facing. The central apexes are separated by gap G. A further useful antenna design is a combines elements of both FIGS. 1 and 2, with a generic bow-tie antenna structure, whose central apexes are replaced with square facing edges. This may be termed a blunted bow-tie.

Bow tie antennas are non-resonant broadband emitters which are useful in applications requiring tenability or wide frequency response.

Upon biasing, and illumination as described with reference to FIG. 1, the antenna emits radiation in the THz frequency range or may be used to detect THz radiation.

Figure 3:
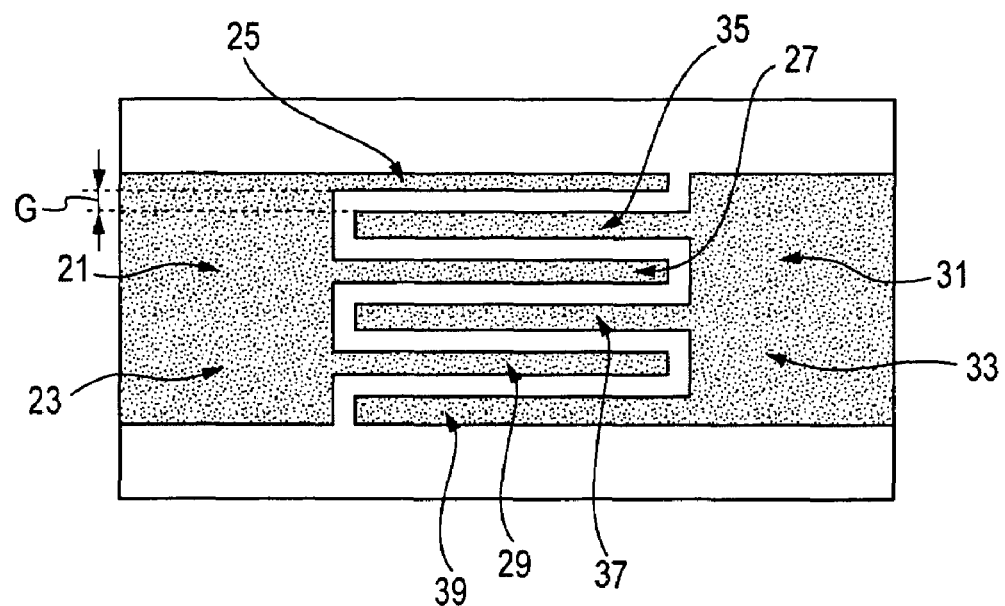
FIG. 3 is a schematic plan view of a photoconducting antenna, where the electrodes have an interdigitated arrangement.

FIG. 3 shows a further antenna design. Here, the electrodes are provided in interdigitated arrangement. First electrode 21 comprises a planar main body 23 with three elongate fingers 25, 27 and 29 connected to said main body 23. The main body 23 and elongate fingers 25, 27 and 29 form a continuous metallic planar structure. Second electrode 31 is identical to first electrode 21 but is rotated through 180°. Second electrode 31 has electrode main body 33 and elongate electrode fingers 35, 37 and 39. Elongate electrode fingers 25, 27 and 29 are of a width and are spaced apart such that elongate fingers 35, 37 and 39 may fit within the gaps provided between spaced apart fingers 25, 27 and 29. Thus, the contacts are interdigitated due to the interleaving of the electrode fingers.

The elongated edges of adjacent electrode fingers provide the facing edges and the gap G is the gap between facing edges. Dependent on the exact configuration of the electrodes, a facing edge may also be formed between the main body 23 of the first electrode and the short edges of elongate fingers 35, 37 and 39 of the second electrodes or the main body of 33 of the second electrode and the elongate fingers 25, 27 and 29 of the first electrode.

The interdigitated antenna of FIG. 3 is of particular use with CW radiation.

Figure 4:
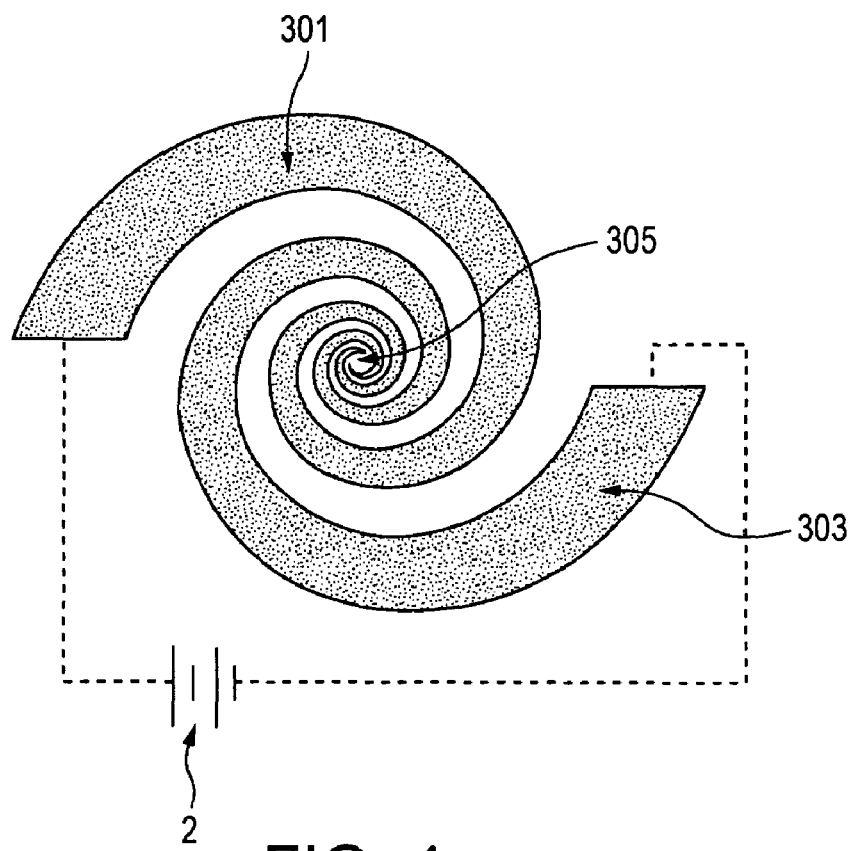
FIG. 4 is a schematic plan view of a photoconducting antenna, where the electrodes have a spiral formation.

FIG. 4 schematically illustrates a so-called spiral antenna. The spiral antenna comprises a first electrode 301 which is formed in a spiral shape and a second electrode 303 which is also formed in a spiral shape. The first electrode 301 and second electrode 303 are centred around the same point such that they are wrapped together. The width of the first electrode 301 and the second electrode 303 increase in width as they extend from the center 305 and the diameter of the electrode from the centre increases as the electrode is wrapped out. This arrangement is usually termed a self-complementary spiral.

The first electrode 301 and the second electrode 303 are wrapped together such that the space between the two electrode decreases as the diameter above the centre 305 decreases. A gap is provided between the two electrodes at the centre 305. This gap may by left as a gap or an interdigitated electrode arrangement (see FIG. 3) may be provided in this gap.

Spiral antennas like bow-tie antennas are non-resonant broadband emitters which are useful in applications requiring tenability or wide frequency response. Upon biasing and illumination as described with reference FIG. 1, the antenna either emits radiation in the THz frequency range or can detect THz radiation.

Figure 5:
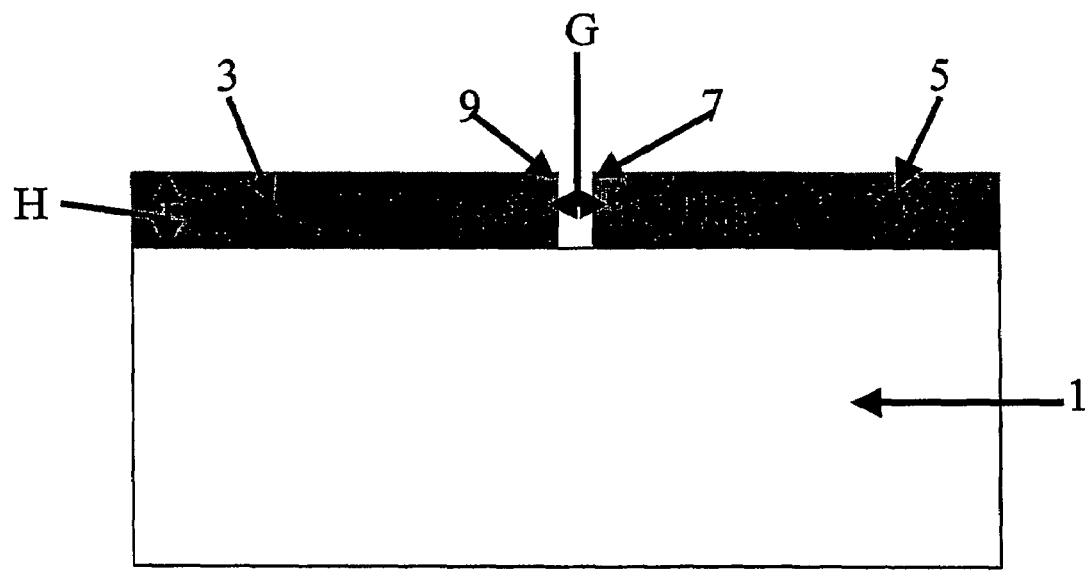
FIG. 5 is a schematic cross-section of photoconducting antenna, the cross section taken through line A-A' of FIG. 1.

FIG. 5 schematically illustrates a cross-section through A-A' of the antenna of FIG. 1. To avoid unnecessary repetition, like reference numerals will be used to denote like features.

Planar electrodes 3 and 5 are seen provided on the upper surface of photoconducting material 1. Planar electrodes 3 and 5 have a height H.

As can be seen in FIG. 5, planar electrodes 3 and 5 stand proud of the planar surface of photoconducting material 1 and thus, there is only air between facing edges 7 and 9. Hence, any structural changes to planar electrodes 3 and 5, for example, electromigration during biasing of the electrodes may cause the electrodes to short.

Figure 6:
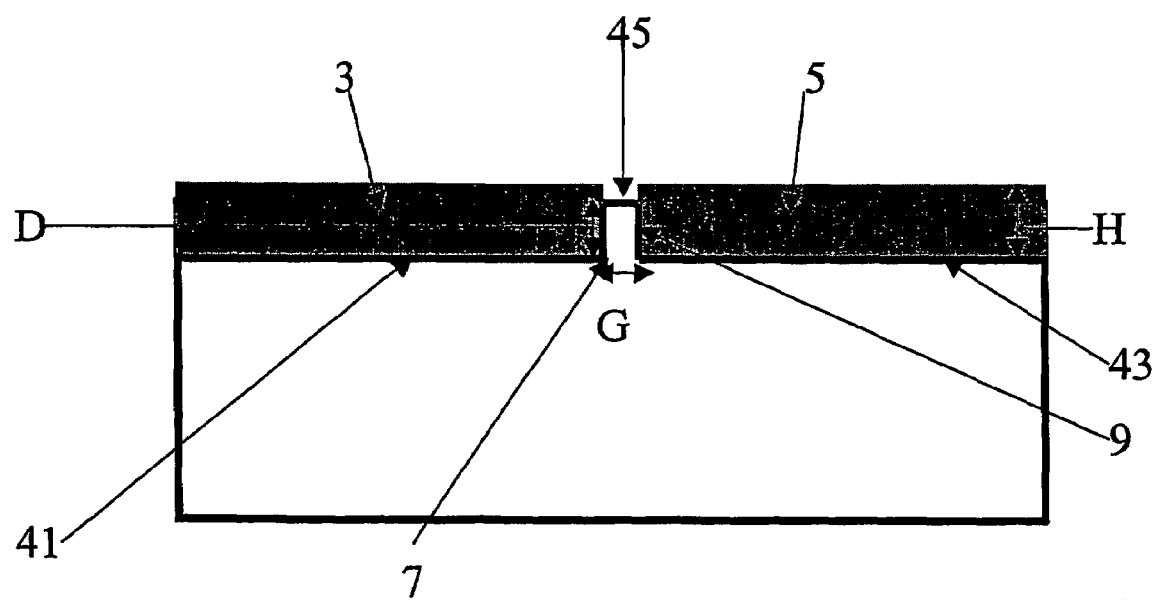
FIG. 6 is a schematic cross-section of a photoconducting antena, where the electrodes are partially recessed into the photoconducting material.

FIG. 6 shows a variation on the structure of FIG. 5. Again, to avoid unnecessary repetition, like reference numerals will be used to denote like features. In this example, photoconducting member 1 is etched to form recesses 41 and 43. The recesses are formed at a depth D below the original planar surface of the photoconducting member 1, such that a ridge of material 45 is provided between two recessed 41 and 43. The electrodes 3 and 5 have a height H which is greater than the depth of the recesses D. Thus, electrodes 3 and 5 protrude above the height of ridge 45. Hence, there is still an unfilled gap between electrodes 3 and 5 which may be degraded due to physical changes in electrodes 3 and 5 caused by electromigration or the like.

Figure 7:
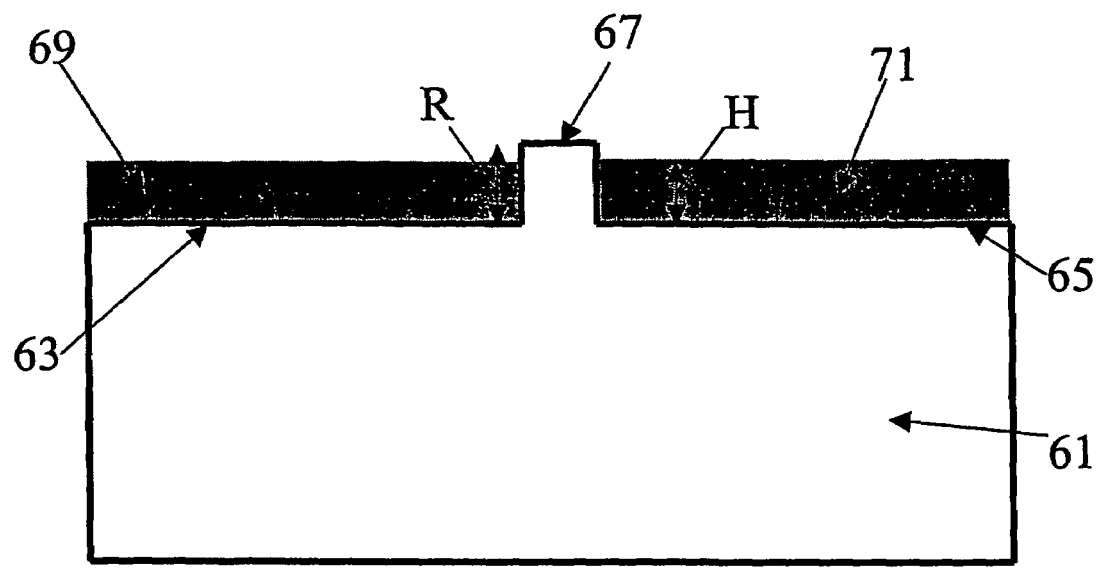
FIG. 7 illustrates a schematic cross-section of a photoconducting antenna in accordance with a first embodiment of the present invention.

FIG. 7 illustrates a cross-section of an antenna in accordance with an embodiment of the present invention. The antenna may be of any one of the type described with reference to FIGS. 1 to 4 or any of the type of photoconducting antenna comprising a photoconducting substrate with electrodes provided on the surface of said substrate.

The antenna comprises photoconducting material 61 which has been etched to form two recesses 63 and 65 both of which have a height R. The recesses are formed such that a ridge 67 having a height R, is provided between the recesses 63 and 65. Electrodes 69 and 71 are provided in recesses 63 and 65. Electrodes 69 and 71 have a height D which is less than that of the ridge R. Therefore, ridge 67 is taller than the height of the electrodes 69 and 71 and hence provides a full barrier between these two electrodes. Any electromigration is thus prevented by ridge 67.

Figure 8:
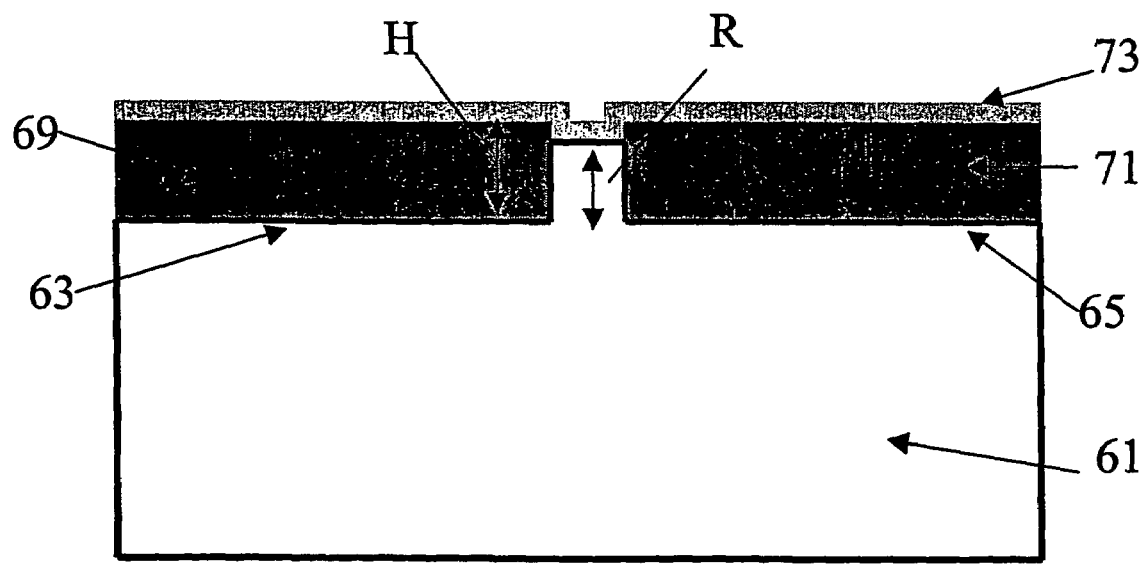
FIG. 8 is a schematic cross-section of a photoconducting antenna in accordance with a second embodiment of the present invention.

FIG. 8 shows a variation on the cross-section in FIG. 7. To avoid unnecessary repetition, like reference numerals will be used to denote like features. In this particular embodiment, the height H of electrodes 69 and 71 exceeds the height of ridge R. However, a capping material 73 is provided overlying both the electrodes and the ridge. The capping material 73 fills gap G such that the facing edge of each electrode 69, 71 is fully covered by either the side wall of ridge R or capping material 73. Thus, electromigration of electrodes 69 and 71 will not result in a narrowing of gap G.

Figure 9:
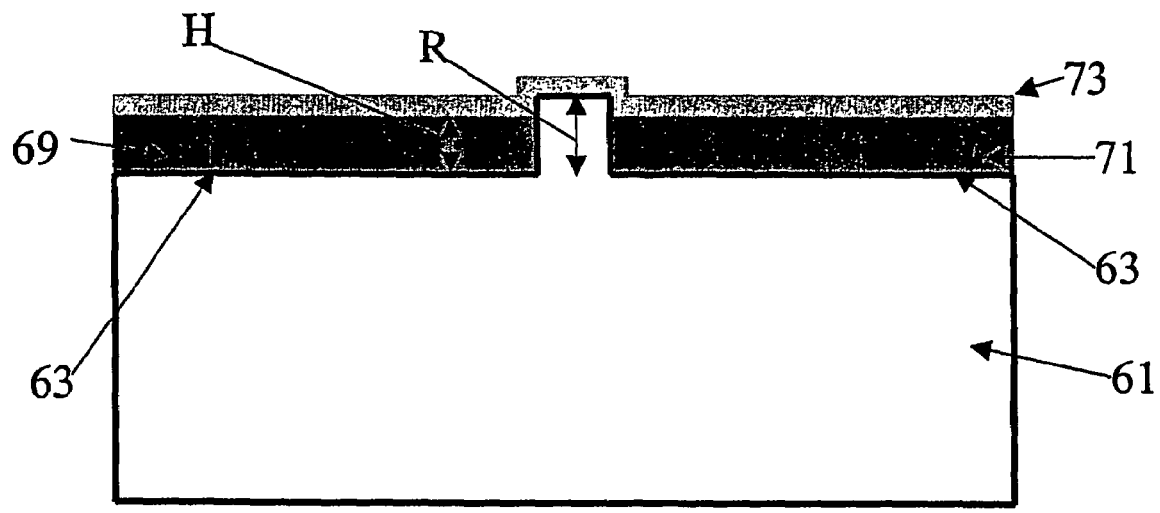
FIG. 9 is a schematic cross-section of a photoconducting antenna in accordance with a third embodiment of the present invention.

FIG. 9 shows a further variation on the structures of 7 and 8. To avoid unnecessary repetition, like reference numerals are used to denote like features. As in FIG. 6, the height H of the electrodes is less than that of the ridge R. Therefore, the ridge R provides a full barrier between electrodes 69 and 71. However, capping material 73 is also provided overlying both the ridge and electrodes. The capping material is an anti-reflective material which will enhance power output from the antenna when the antenna is configured as an emitter or will enhance sensitivity of the antenna if used as a detector.

Figure 10:
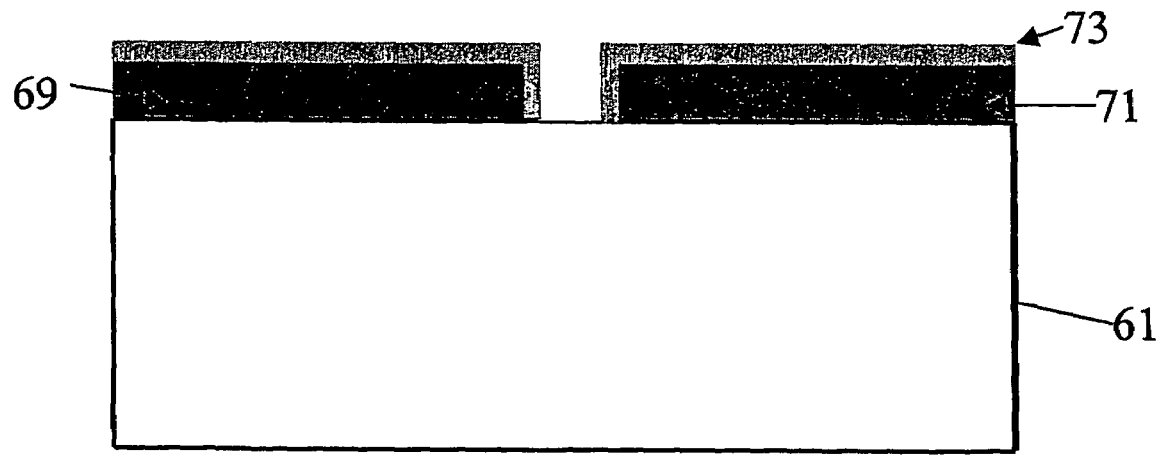
FIG. 10 is a schematic cross-section of a photoconducting antenna in accordance with a fourth embodiment or the present invention.

FIG. 10 illustrates a further embodiment of the present invention. Here, electrodes 69 and 71 are provided overlying and in contact with a planar surface of photoconducting material 61. The electrodes are spaced apart by gap G as shown in FIGS. 6 and 7. The facing edges of the electrodes 75 and 77 are covered by capping material 73 which extends across both the electrodes 69 and 71. The capping material 73 thus provides a physical barrier between electrodes 69 and 71 and hence prevents degradation of the antenna due to electromigration.

FIGS. 11A to 11E schematically illustrate a preferred fabrication method for a photoconducting antenna. A photoconducting substrate 1 comprising a material such as LT-GaAs, LT-AlGaAs, As—GaAs or LT-InGas is covered by a layer of resist which may be processed using either optical or electron beam techniques. For example, for optical techniques photoresist is spun onto the surface of photoconducting substrate 1. For electron beam techniques PMMA or other suitable polymer substance is spun onto the surface of photoconducting material 1.

The photoresist or electron beam resist 81 is then patterned in the standard way. For example, for photoresist, the photoresist is exposed to suitable radiation through a mask in order to expose central area 83 to the radiation. The photoresist and photoconducting material 1 is then immersed in developer to dissolve central area 83. For electron beam resist, the central area 83 is irradiated using an electron beam and the electron beam resist and photoconductive material is immersed in a suitable developer in order to dissolve the central area 83.

Figure 11A:
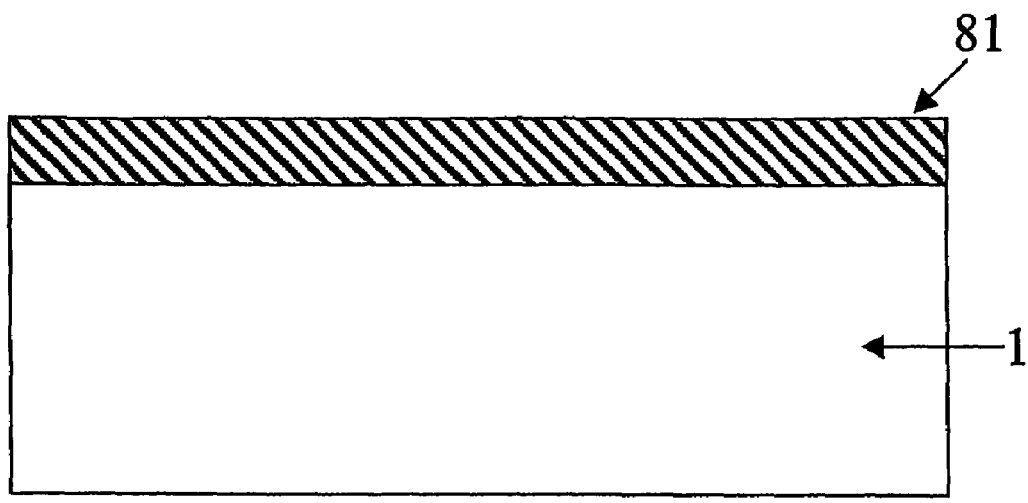
Figure 11B:
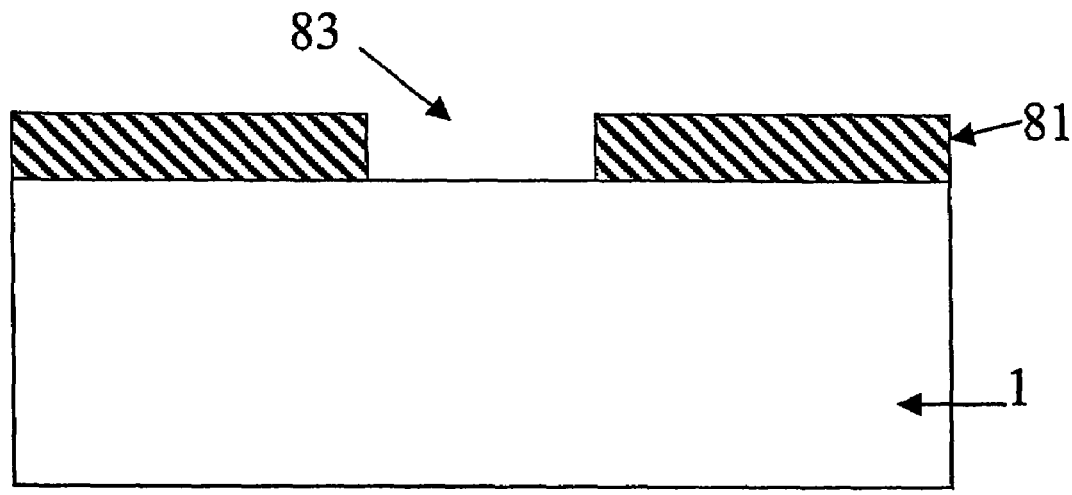
Figure 11C:
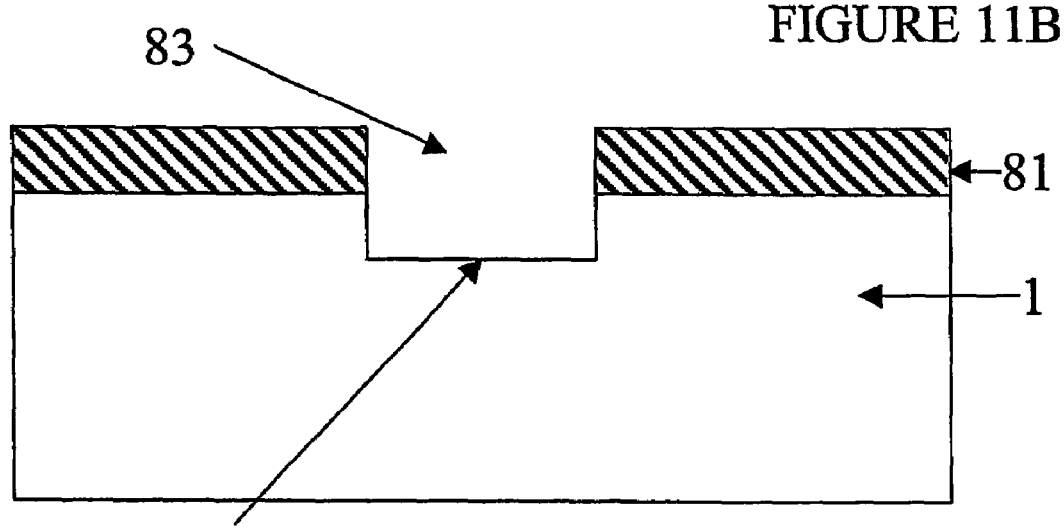
Figure 11D:
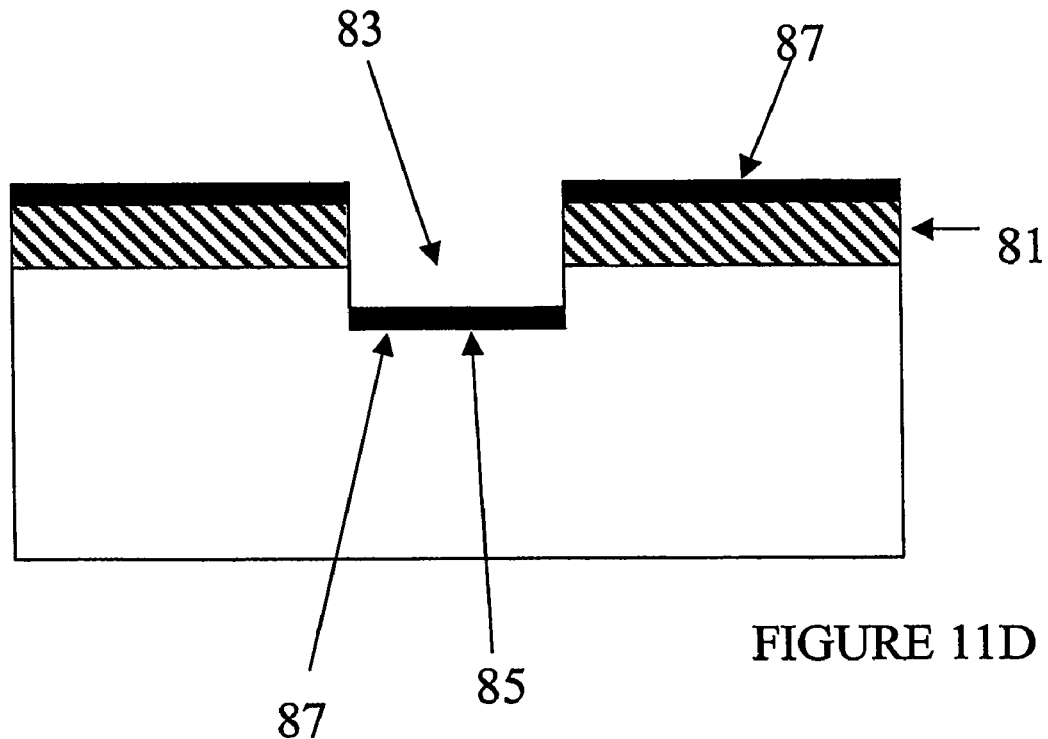

The structure is then etched through central area 83 as shown in FIG. 11C to form a trench 85. This may be achieved through wet chemical etching (using, as an example for GaAs materials, HF or $H_2SO_4/H_2O_2$ solutions) or reactive ion etching (example $SiCl_4$ plasmas with GaAs), the latter being preferable because with appropriate conditions near vertical etches can be achieved. Alternatively, other suitable techniques are known to those skilled in the art. The photoresist remains on the sample and then metal layer 87 is evaporated the trench and photoresist as shown in FIG. 11D.

Figure 11E:
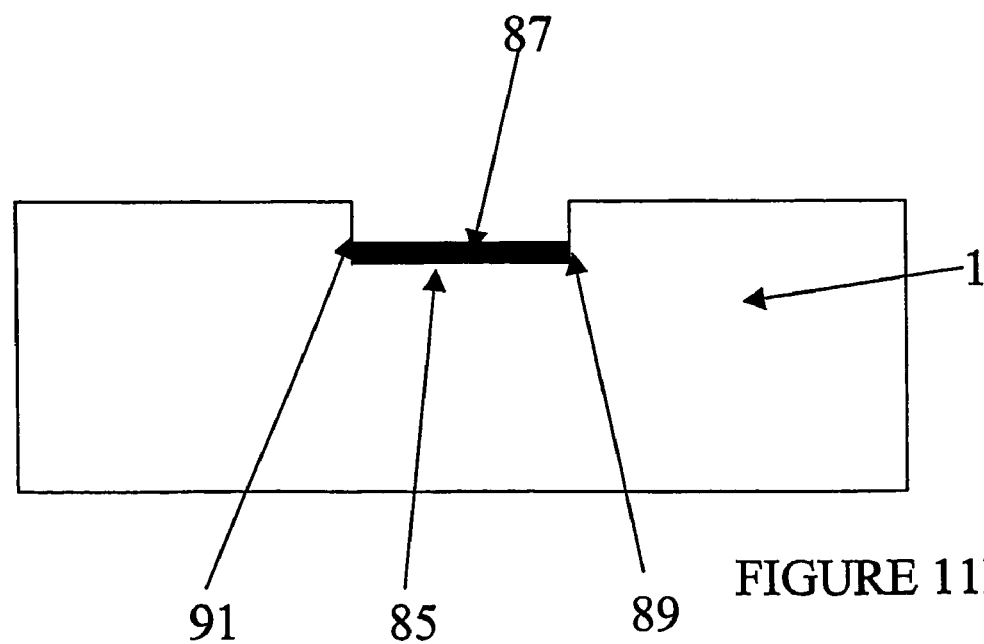

As the photoresist layer 81 is used to both define the trench for etching and the metallization regions, this is known as a self-aligned technique. The photoresist is then dissolved as shown in FIG. 11E leaving just trench 85 metallization 87. The side walls of the trench 89 and 91 may be used to provide a barrier to electromigration as described with reference to FIGS. 7 to 9.

FIG. 12 is a photograph of a photoconducting antenna having interdigitated electrodes 101 and 103. The electrodes 101 and 103 are of the planar type such that they are provided on the planar surface of photoconducting material 105 as schematically illustrated in cross-section of FIG. 5. After subsequent electrical testing of the device using nominally low currents, e.g. <1 mA, electromigration caused failure of the device.

This can be seen in both FIGS. 12 and 13. FIG. 13 illustrates the same device as FIG. 12 but at a higher magnification. In FIGS. 12 and 13, the anode 101 attracts high density current flow of the majority carriers (electrons), this causes the metal edges of the fingers 107 of the anode 101 to become blurred by movement of the metal atoms. The fingers 109 of the cathode do not experience such a high current density and hence remain sharp. The antenna was found to fail after less than 10 hours of operation.

FIG. 14 illustrates a bow-tie antenna of the type illustrated in FIG. 2. The antenna is a planar antenna and is thus formed on the planar surface of the photoconducting material as shown in FIG. 5.

It can be seen in FIG. 14 that when the electrodes 111 and 113 fail, the semiconductor material 115 which lies there between is completely destroyed.

To circumvent this problem, the present invention forms a physical barrier at the facing edges of the electrodes. This is conveniently done by etching the photoconductive material and to form a trench and to fill in the trench with metal such that the side walls of the trench exceed the height of the metal filling the trench and thus the metallization is completely subsurface.

The inventors have noted that etching of fine features using common etching techniques can produce trenches of reduced depth when compared to an identical etch on a larger exposed area It is therefore useful to be able to measure the etch depth in order to ensure that the metallization remains subsurface. This is achieved by simultaneously etching features of a similar size to those required, on the edge of the sample under manufacture. The crystal is then cleaved perpendicularly through these standardisation patterns, and the discarded crystalline piece is returned to an electron microscope for characterisation.

FIG. 15 illustrates a standardisation trench which has been formed using reactive ion etching using a silicon tetra-chloride plasma. This characterisation image dictates the thickness of metal required, and metal such as Ti, Pd or Au is then evaporated into the trench 121 as explained with reference to FIGS. 11A to 11E. It can be seen from FIG. 16 that the metallization 123 lies below the surface 127 of trench 121.

FIGS. 12 and 13 illustrate planar electrodes which suffer failure due to electromigration. FIGS. 17 to 20 illustrate an interdigitated electrode which has recessed electrodes but which could in principle can also suffer from electromigration problems, and indeed did suffer other failure mechanisms, due to the fact that some metal features from the electrodes slightly protrude over the tops of the recesses. In FIG. 17, an interdigitated electrode antenna is shown having a first electrode 201 and a second electrode 203. One of the fingers 205 from the second electrode 203 has a metal shard 207 which protrudes above the recess.

FIG. 18 illustrates the device shown in FIG. 17 after failure. The gap in these antennas is about 1.7 μm and was run at a fairly high bias of 22 volts. This meant that a current of approximately 1 A was run through the device. In the device before failure, the resistance was 4.7 megaohms, after failure the resistance was 750 ohms. It can be seen that the circled area 209 in FIG. 17 has completely changed in FIG. 18.

FIG. 19 and 20 illustrate the circled area of FIG. 17 at a higher magnification. It appears that the shard of metal 207 of FIG. 17 has caused the failure. This sharp feature of this shard is associated with a singularity in the electric field, and furthermore lies closer than 1.7 μm to the adjacent electrode. Both effects combine so that, although the average electric field may be below breakdown, the local field at this point may exceed it and lead to catastrophic failure.

The above effect is not dependent on electromigration, and would be caused by any sharp metal features protruding above the surface, and for which the local field exceeds the breakdown threshold. However, electromigration would, over time, increase the likelihood of such breakdown, by reducing the separation of such features from neighbouring electrodes.

The presence of these metal shards in FIGS. 17-20 are a facet of the metal deposition technique, and their presence can be eliminated by appropriate metallization (see FIG. 23). The above techniques can be used to ensure that all metallization is subsurface, smooth and bounded.

FIG. 21 illustrates recessed electrode fingers 221, 223 located in recesses 225 and 227 respectively. The unevenness of the metal proves that it is necessary to have a recess which is taller than the height of the electrode. This unevenness is shown in more detail in FIG. 22 where the metal 231 is shown in recess 233. FIG. 23 again illustrates a recessed electrode where metal 241 is provided within trench 243. In this particular example, smoother metallization is seen. This is due to depositing the metal at a rate of less than 0.2 nm per second. This allows jagged shards of metal to be reduced.

Careful control of the metallization in this way allows fine control of the metal thickness, to the degree that metal surfaces flush with the bounding semiconductor surface can be achieved. Typically, however, a small (around 50 nm) gap is left with the metal subsurface, as a margin for error, for the above reasons. In the case of uneven metallization, the problems of above surface protrusion could in principle be overcome by increasing this gap to a size that is greater than the lengthscale of the metal roughness. However, in the present application, this is to be avoided, because for maximum efficiency the largest optical field intensity must be spatially located in the region of maximum electric field. The latter is in the crystalline regions lying directly between the buried antenna electrodes. The optical field intensity diminishes exponentially from the surface due to light absorption, with an absorption length of typically less than 1 μm, so the metal electrodes are placed as close to the surface as reasonably possible.

The invention claimed is:

1. An antenna comprising a layer of a single photoconductive material and a plurality of spaced apart electrodes provided on said photoconductive material layer, each electrode having at least one facing edge which faces a facing edge of an adjacent electrode, a physical barrier being provided abutting a facing edge of at least one electrode, said barrier extending to at least the full height of said facing edge, wherein the facing edge of the at least one electrode is provided within a recess of the surface of said layer of photoconductive material such that said barrier is formed from said single photoconductive material, said recess including side-walls formed from said photoconductive material, and one of said sidewalls of said recess providing said barrier.

2. An antenna according to claim 1, wherein the facing edges of adjacent electrodes are provided within recesses, such that the side walls of said recesses provides the barriers for both facing edges, and wherein said photoconductive material is provided between said adjacent facing edges.

3. An antenna according to claim 1, wherein said sidewalls extend to at least the full height of said facing edge.

4. An antenna according to claim 3, wherein a capping material is provided over said electrodes.

5. An antenna according to claim 4, wherein said capping material is an antireflective material.

6. An antenna according to claim 4, wherein said capping material comprises silicon nitride, silicon dioxide, silicon monoxide, photoresist, polymide or acrylics.

7. An antenna according to claim 1, wherein a capping material is provided over at least a part of the facing edges such that said capping material and the sidewalls of said recess form said barrier.

8. An antenna according to claim 1, wherein the height of the side walls exceeds the height of the said facing edge by at most twice the penetration depth of the radiation used to excite the antenna, in the photoconductive material.

9. An antenna according to claim 1, wherein the height of the side walls exceeds the height of the said facing edge by at most the penetration depth of the radiation used to excite the antenna, in the photoconductive material.

10. An antenna according to claim 1, wherein the height of the sidewalls exceeds the height of the facing edge by at most 1 μm.

11. An antenna according to claim 1, wherein the electrodes are provided on a planar surface of said photoconductive material and a capping material is provided on the facing edges of said electrodes such that said capping material forms said barrier.

12. An antenna according to claim 1, wherein two electrodes are provided in a 'bow-tie' configuration, each electrode having a triangular portion and being arranged such the apexes of said triangular portion face each other and are spaced apart, said facing edges being provided by said apexes.

13. An antenna according to claim 1, wherein two electrodes comprise a plurality of elongate fingers, provided in an interdigitated arrangement with the facing edges being provided by the elongate edges of adjacent fingers.

14. An antenna according to claim 13, wherein the gap between the facing edges is at most 100 μm.

15. An antenna according to claim 1, wherein the gap between facing edges is at most 100 μm.

16. An antenna according to claim 1, wherein the photoconductive material comprises a least one selected from LT-GaAs, LT AlGaAs, As-GaAs or LT-InGaAs.

17. An antenna according to claim 1, wherein said electrodes comprise at least one selected from Gold, Aluminium, Titanium, NiCr or Pd.

18. An antenna according to claim 1, further comprising biasing means configured to apply a bias between facing edges of adjacent electrodes, said biasing means being configured to bias the electrodes such that the current density at their facing edges exceeds the current density at which electromigration occurs.

19. An antenna according to claim 1, said antenna being configured to irradiate radiation in the frequency range from 0.25 GHz to 100 THz.

20. An antenna according to claim 1, further comprising means for measuring the current flowing through the electrodes.

21. An antenna according to claim 20, being configured to detect radiation in the frequency range from 0.25 GHz to 100 THz.

* * * * *

UNITED STATES PATENT AND TRADEMARK OFFICE
CERTIFICATE OF CORRECTION

PATENT NO. : 7,609,208 B2
APPLICATION NO. : 10/526556
DATED : October 27, 2009
INVENTOR(S) : Evans et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 826 days.

Signed and Sealed this

Twelfth Day of October, 2010

David J. Kappos
*Director of the United States Patent and Trademark Office*